(12) United States Patent
Omiya et al.

(10) Patent No.: US 8,419,094 B2
(45) Date of Patent: Apr. 16, 2013

(54) NON-CONTACT TRANSPORT APPARATUS

(75) Inventors: Taira Omiya, Moriya (JP); Katsuaki Takahashi, Toride (JP); Koji Iida, Abiko (JP)

(73) Assignee: SMC Kabushiki Kaisha, Tokyo (JP)

( * ) Notice: Subject to any disclaimer, the term of this patent is extended or adjusted under 35 U.S.C. 154(b) by 29 days.

(21) Appl. No.: 13/098,858

(22) Filed: May 2, 2011

(65) Prior Publication Data

US 2011/0278870 A1 Nov. 17, 2011

(30) Foreign Application Priority Data

May 11, 2010 (JP) ................................. 2010-108927

(51) Int. Cl.
*A47J 45/00* (2006.01)

(52) U.S. Cl.
USPC .......................... 294/64.3; 294/188; 269/21

(58) Field of Classification Search ............... 294/64.3, 294/183, 188; 269/20, 21; 414/676, 752.1; 406/86, 88, 92; 901/40
See application file for complete search history.

(56) References Cited

U.S. PATENT DOCUMENTS

| | | | | |
|---|---|---|---|---|
| 4,029,351 A | * | 6/1977 | Apgar et al. ................. | 294/64.3 |
| 7,452,016 B2 | * | 11/2008 | Tanae ........................... | 294/64.3 |
| 7,510,226 B2 | * | 3/2009 | Akiyama ..................... | 294/64.3 |
| 2006/0070422 A1 | * | 4/2006 | Kempf et al. ................ | 72/405.1 |
| 2006/0113719 A1 | * | 6/2006 | Nagai et al. .................. | 269/20 |

FOREIGN PATENT DOCUMENTS

| | | |
|---|---|---|
| JP | 61-229750 | 10/1986 |
| JP | 7-50336 | 2/1995 |
| JP | 10-181879 | 7/1998 |
| JP | 2005-251948 | 9/2005 |
| JP | 2006-346783 | 12/2006 |
| JP | 2009-032744 | 2/2009 |

* cited by examiner

*Primary Examiner* — Dean Kramer
*Assistant Examiner* — Stephen Vu
(74) *Attorney, Agent, or Firm* — Oblon, Spivak, McClelland, Maier & Neustadt, L.L.P

(57) ABSTRACT

A non-contact transport apparatus includes a housing and a plate which is fitted into a circular recess formed at a central portion in a lower surface of the housing. The housing is formed in an octagonal shape corresponding to the shape of a workpiece to be transported. In the plate, a plurality of nozzles are arranged radially at equal angular intervals. The nozzles include first nozzle grooves and second nozzle grooves having cross sectional areas that are determined in proportion to distances between a principal side of the housing and the nozzle and between an oblique side of the housing and the nozzle for making the flow rates of the pressure fluid through the first nozzle groove and the second nozzle groove different.

6 Claims, 13 Drawing Sheets

NON-CONTACT TRANSPORT APPARATUS

CROSS-REFERENCE TO RELATED APPLICATION

This application is based upon and claims the benefit of priority from Japanese Patent Application No. 2010-108927 filed on May 11, 2010, of which the contents are incorporated herein by reference.

BACKGROUND OF THE INVENTION

1. Field of the Invention

The present invention relates to a non-contact transport apparatus capable of retaining and transporting a thin-plate-like workpiece in a non-contact state by attracting the workpiece under suction.

2. Description of the Related Art

Heretofore, for example, when a thin-plate-like workpiece such as a liquid crystal glass substrate for use in a liquid crystal display device, a semiconductor wafer, etc. is transported, a non-contact transport apparatus has been used, which is capable of floating and retaining the workpiece by use of fluid.

Such a non-contact transport apparatus, for example, as disclosed in Japanese Laid-Open Patent Publication No. 10-181879, includes a transport pad having a plurality of passages extending vertically therethrough. A pressure fluid supplied to the passages blows out from openings formed at a lower end portion of the transport pad, and the pressure fluid flows along the lower surface of the transport pad. The non-contact transport apparatus incorporating therein the transport pad is moved above and closer to the workpiece by use of a robot arm, etc. As a result, the pressure fluid flows at a high speed between the lower surface of the transport pad and the workpiece, whereby a negative pressure is generated by the Bernoulli effect, and thus the workpiece is attracted toward and retained by the transport pad under suction in a non-contact state.

Also, Japanese Laid-Open Patent Publication No. 2006-346783 discloses a non-contact transport apparatus which includes a supply pillar having a fluid supply port and a discharge pad fixed onto a lower portion of the supply pillar. The discharge pad includes a fluid discharge passage that is open along the circumferential direction. The fluid discharge passage is made up of a gap formed continuously along the circumferential direction of the discharge pad. The pressure fluid supplied from the fluid supply port flows from the fluid discharge passage along the circumferential direction of the discharge pad. As a result, a negative pressure is generated, and thus the workpiece is attracted under suction.

In general, such non-contact transport apparatuses transport a circular-disk shaped workpiece such as a semiconductor wafer, etc. In order to retain such a workpiece, the apparatuses flow a pressure fluid radially from the center of the transport pad through an opening thereof.

SUMMARY OF THE INVENTION

A general object of the present invention is to provide a non-contact transport apparatus which is capable of retaining and transporting a non-circular workpiece reliably and stably by supplying a pressure fluid at an amount depending on the shape of the workpiece.

According to the present invention, a non-contact transport apparatus for attracting a workpiece under suction by supply of a pressure fluid, and retaining and transporting the workpiece in a non-contact state, the non-contact transport apparatus comprising:

a body which is formed into an outer shape corresponding to the shape of the workpiece; and a fluid discharge section provided on an end face of the body facing the workpiece, the fluid discharge section including a plurality of discharge holes for discharging the pressure fluid along the end face, wherein the body includes a plurality of outer edge sections, distances between the discharge holes and the outer edge sections being different; and wherein the discharge holes face the outer edge sections, and have cross sectional areas which are formed in proportion to the distances between the discharge holes and the outer edge sections.

According to the present invention, the body is formed into an outer shape having a plurality of outer edge sections and corresponding to the shape of a workpiece, and the body includes, on an end face thereof, the fluid discharge section facing the workpiece. The fluid discharge section includes a plurality of discharge holes for discharging a pressure fluid along the end face of the body. The cross sectional areas of the discharge holes are determined in proportion to distances between the discharge holes and the outer edge sections.

Thus, the pressure fluid is discharged through the discharge holes having cross sectional areas that are determined depending on the distances between the discharge holes and the outer edge sections, whereby the pressure fluid can be supplied along the end face of the body up to near the outer edge sections at substantially same flow rates. Accordingly, the pressure fluid flows to positions facing respective portions of a non-circular workpiece at adequate flow rates, and then a negative pressure is generated at the positions. Thus, the workpiece can be retained and transported reliably and stably as a result of the negative pressure.

The above and other objects features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
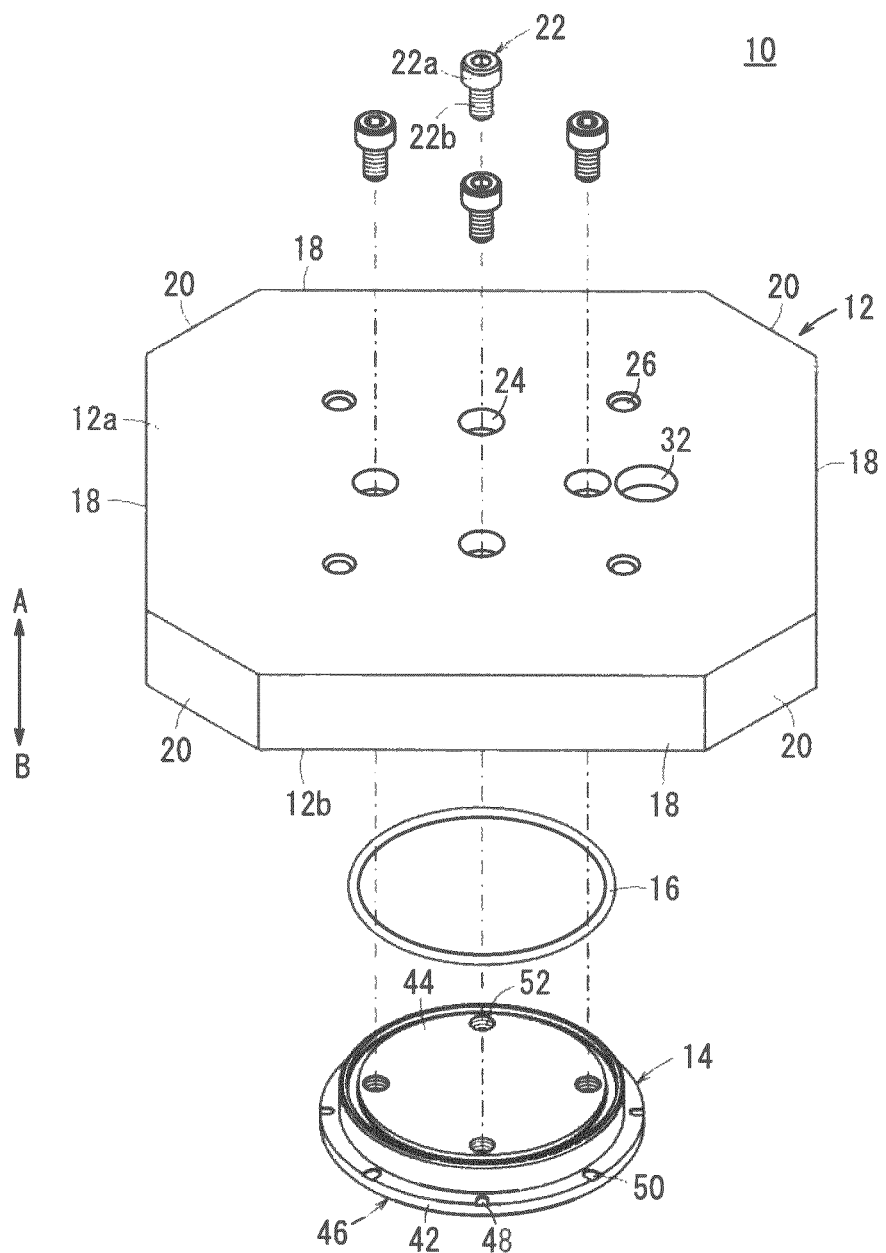
FIG. 1 is an exploded perspective view of a non-contact transport apparatus according to a first embodiment of the present invention.

Preferred embodiments of a non-contact transport apparatus according to the present invention shall be presented and described in detail below with reference to the accompanying drawings. In FIG. 1, reference numeral 10 denotes a non-contact transport apparatus according to a first embodiment of the present invention.

As shown in FIGS. 1 to 6, the non-contact transport apparatus 10 includes a housing (body) 12, a circular-disk plate (fluid discharge section) 14 disposed at a central portion of the housing 12, and a sealing ring 16 disposed between the housing 12 and the plate 14.

The housing 12 is formed into a metal block, for example, and formed into an octagonal shape obtained by cutting off the four corners of a square shape at a certain angle. More specifically, the shape of the housing 12 is formed so as to correspond to the shape of a workpiece S to be transported by the non-contact transport apparatus 10. For example, in a case where the workpiece S is a solar cell, in order to match the shape of the housing 12 with the shape of the workpiece S, the shape of the housing 12 is formed so as to have four principal sides (first sides) 18 arranged perpendicularly to each other, and four oblique sides (second sides) 20 each connecting adjacent principal sides and which are inclined at 45 degrees relative to the principal sides 18. The principal sides 18 and the oblique sides 20 jointly form outer edge sections of the outer shape of the housing 12.

Figure 3:
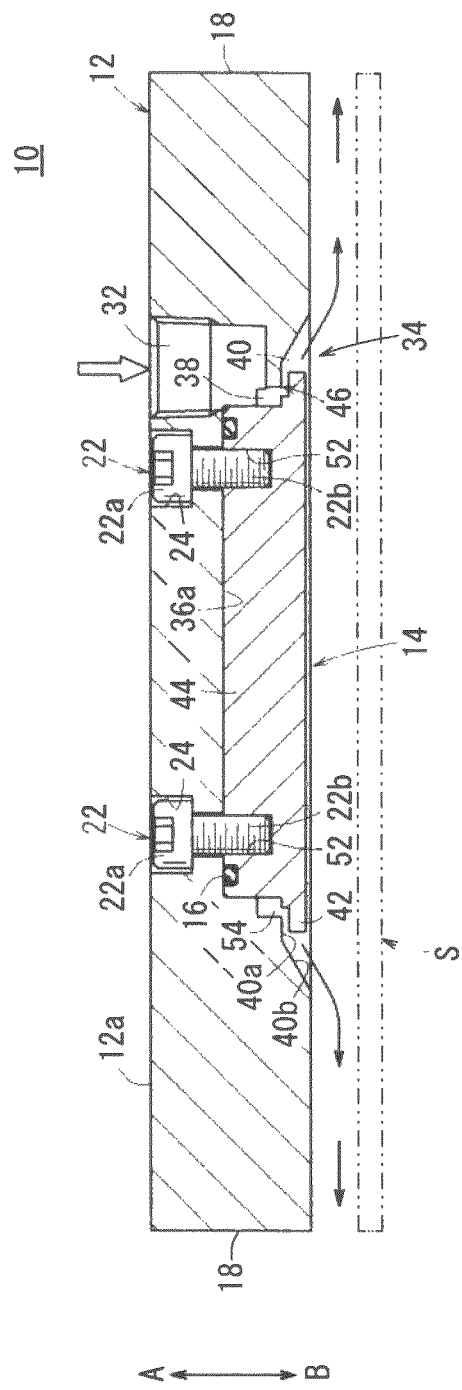
FIG. 3 is an overall cross sectional view of the non-contact transport apparatus of FIG. 1.
Figure 4:
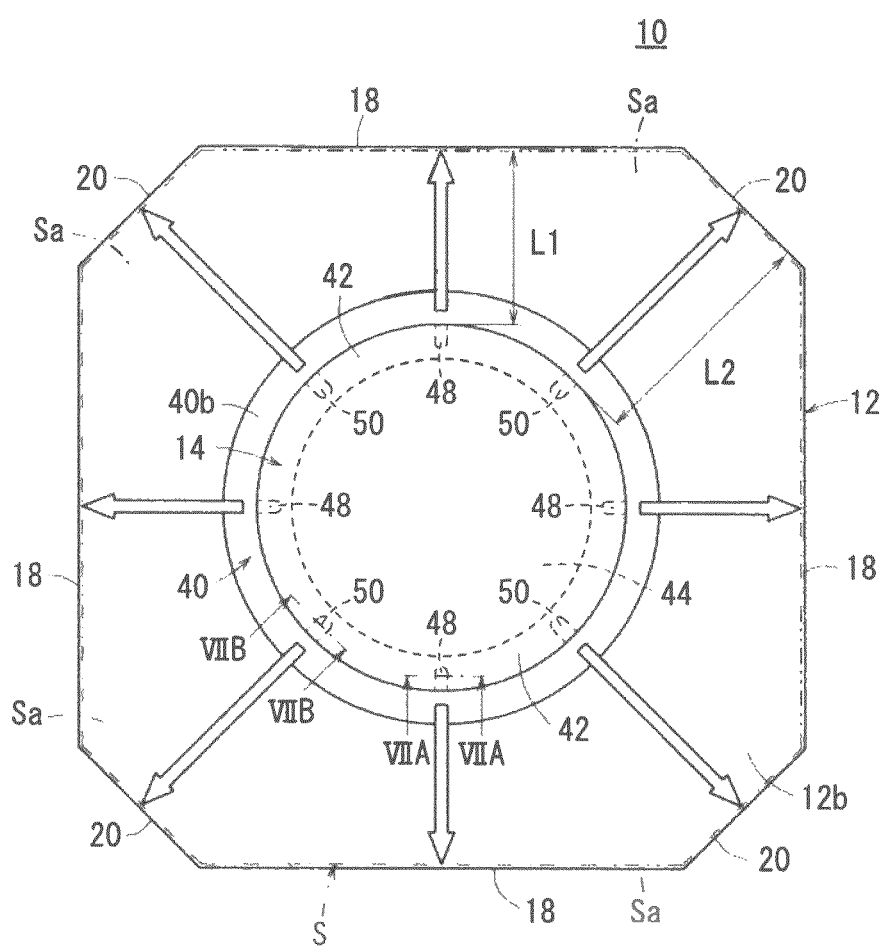
FIG. 4 is a plan view of the non-contact transport apparatus of FIG. 1 as viewed from a lower surface thereof.

As shown in FIGS. 3 and 4, the size of the housing 12 is substantially equal to or slightly smaller than the size of the workpiece S to be transported by the non-contact transport apparatus 10.

On the upper surface 12a of the housing 12, there are formed a plurality of (for example, four) bolt holes 24 through which fixation bolts 22 are inserted for fixing the plate 14. Near the bolt holes 24, there are formed a plurality of (for example, four) attachment holes 26 (see FIG. 1).

The bolt holes 24 are formed on a circle at equal angular intervals, the circle having a certain radius around the center of the housing 12. The bolt holes 24 extend through the housing 12 in the thickness direction. Each of the bolt holes 24 has a large diameter portion for receiving a head 22a of the fixation bolt 22 on the upper surface 12a side (in a direction indicated by arrow A), and a small diameter portion through which a screw 22b of the fixation bolt 22 is inserted on the lower surface (end face) 12b side (in a direction indicated by arrow B).

The attachment holes 26 are arranged radially outside of the bolt holes 24. By screwing unillustrated bolts into the attachment holes 26, the housing 12 is joined to an end of an arm of a robot, etc.

On the upper surface 12a of the housing 12, there is formed a supply port 32 adjacent to one of the bolt holes 24. The supply port 32 is open on the upper surface 12a of the housing 12, and is connected to a pipe (not shown) to which a pressure fluid is supplied from an unillustrated pressure fluid supply source.

On the other hand, on the lower surface 12b of the housing 12, there is substantially centrally formed a circular recess 34 which functions as a workpiece retaining surface for retaining the workpiece S in a non-contact state.

The recess 34 is formed such that a plate 14 to be described later can be fitted into the recess 34. The recess 34 includes a first hole 36, a second hole 38, and a third hole 40. The first hole 36 is closest to the upper surface 12a of the housing 12 (in the direction indicated by arrow A). The second hole 38 is adjacent to the first hole 36, and has a diameter which radially outwardly increases compared to the diameter of the first hole 36. The third hole 40 is the closest to the lower surface 12b of the housing 12 (in the direction indicated by arrow B), and has a diameter which further radially outwardly increases compared to the diameter of the second hole 38.

Figure 2:
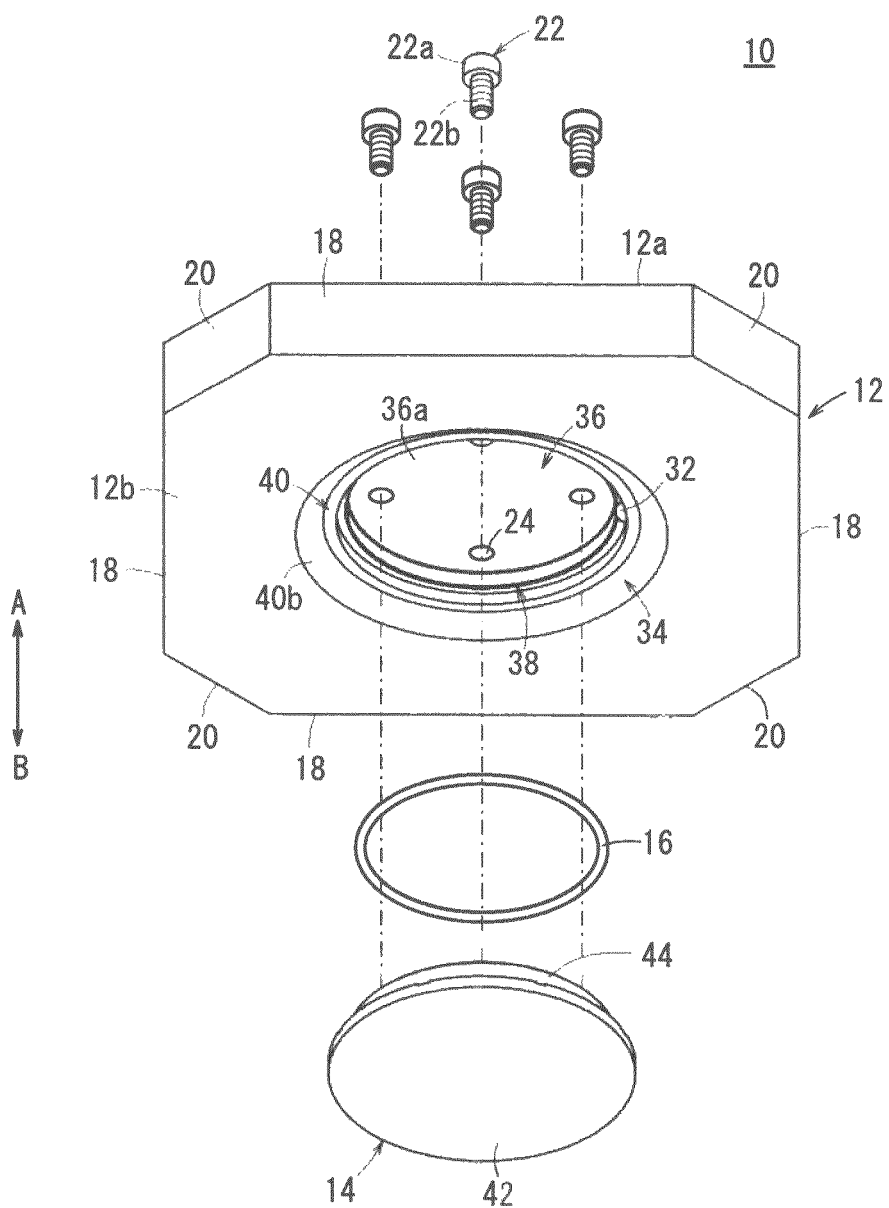
FIG. 2 is an exploded perspective view of the non-contact transport apparatus as viewed in a direction different from the direction in FIG. 1.

More specifically, as shown in FIGS. 2 and 3, in the recess 34, the first hole 36, the second hole 38, and the third hole 40 are arranged in this order from the upper surface 12a of the housing 12 (in the direction of arrow A) toward the lower surface 12b of the housing 12 (in the direction of arrow B). The diameter of the recess 34 is increased stepwise toward the lower surface 12b (in the direction of arrow B). Stated otherwise, the recess 34 has the first hole 36 at the deepest position.

The first hole 36 has a substantially flat bottom wall surface 36a, and an inner circumferential surface perpendicular to the bottom wall surface 36a. The bolt holes 24 extend from the upper surface 12a of the housing 12 (the direction of arrow A) to the bottom wall surface 36a of the first hole 36 through the housing 12.

Similarly to the first hole 36, the second hole 38 has a substantially flat bottom wall surface 38a, and an inner circumferential surface 38b perpendicular to the bottom wall surface 38a. The inner circumferential surface 38b of the second hole 38 is adjacent to and communicates with the supply port 32.

Similarly to the first hole 36 and the second hole 38, the third hole 40 has a substantially flat bottom wall surface 40a. Further, the third hole 40 has an inner circumferential surface 40b which is tapered such that the diameter of the third hole 40 progressively increases radially outwardly from the joint portion of the bottom wall surface 40a and the inner circumferential surface 40b. The inclination angle of the inner circumferential surface 40b is, for example, 30 degrees relative to the bottom wall surface 40a.

In the above embodiment, the supply port 32 is open on the upper surface 12a of the housing 12 (the direction of arrow A). However, the present invention is not limited in this respect. For example, the supply port 32 may be open on a side surface of the housing 12 to communicate with the second hole 38.

The plate 14 is made, for example, of a metal material, like the housing 12. The plate 14 includes a circular base 42, and a projection 44 having a diameter smaller than that of the base 42 and which protrudes on the base 42 at a certain height. The outer diameter of the projection 44 is substantially equal to the inner diameter of the first hole 36.

Figure 5:
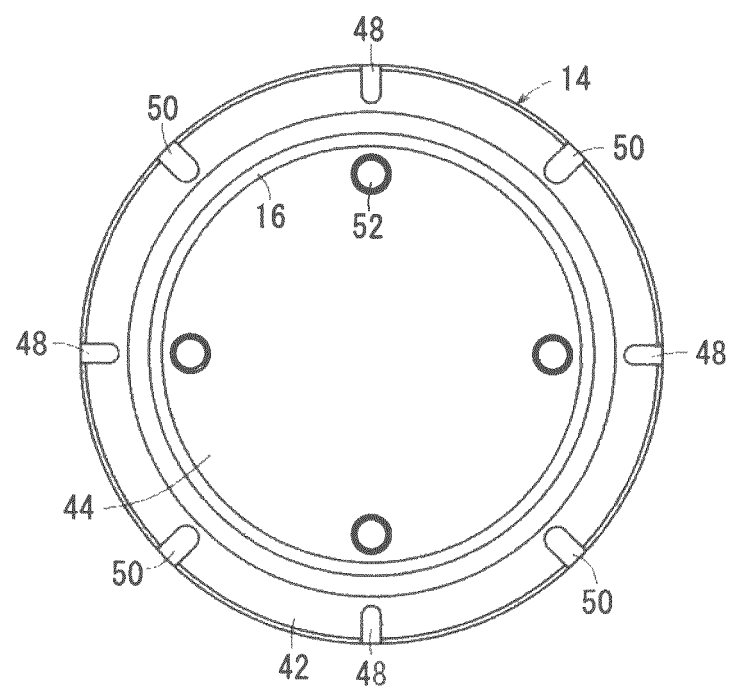
FIG. 5 is a plan view of a plate.
Figure 6:
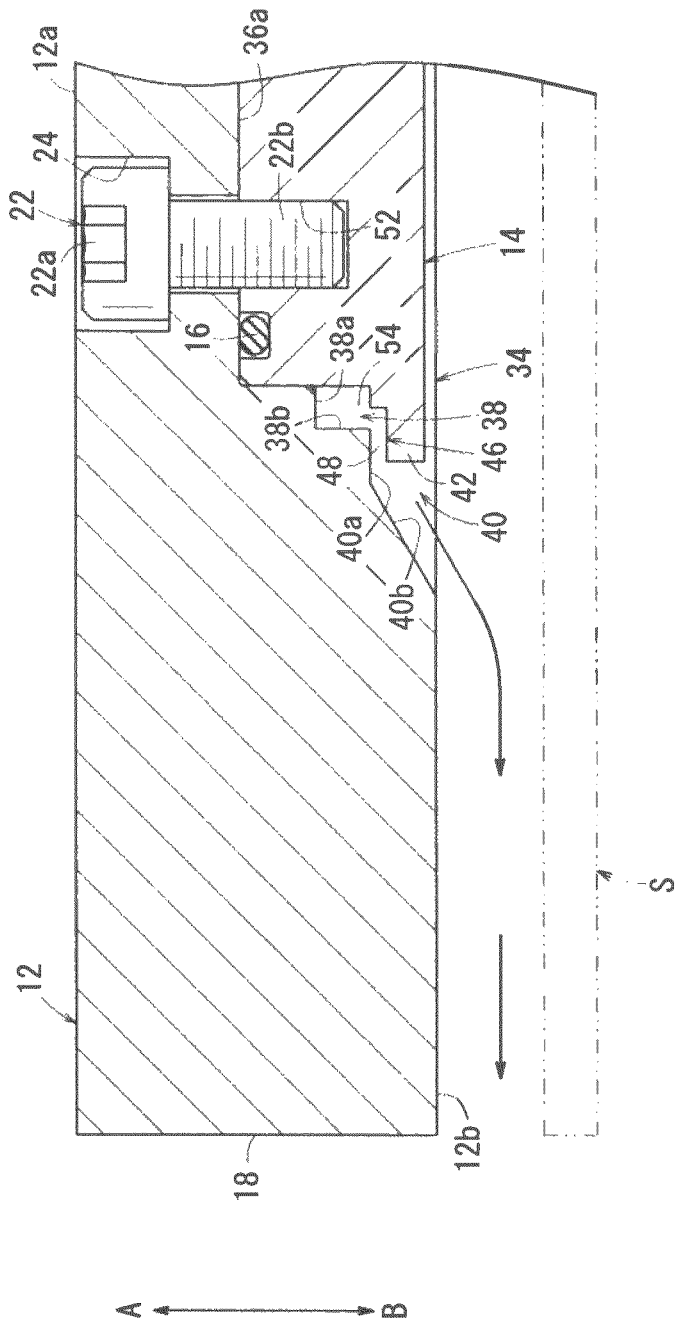
FIG. 6 is an enlarged cross sectional view of FIG. 3.

As shown in FIGS. 1, 4 and 5, on an end face of the base 42 on the projection 44 side, a plurality of nozzles (discharge holes) 46 are radially-arranged for ejecting a pressure fluid to the outside. In the present embodiment, for example, eight nozzles 46 are provided, and are arranged along the circumferential direction of the base 42 at equal angular intervals. Each of the nozzles 46 is made up of a groove having a certain depth relative to the end face of the base 42 and which extends in the radial direction of the base 42.

Figure 7A:
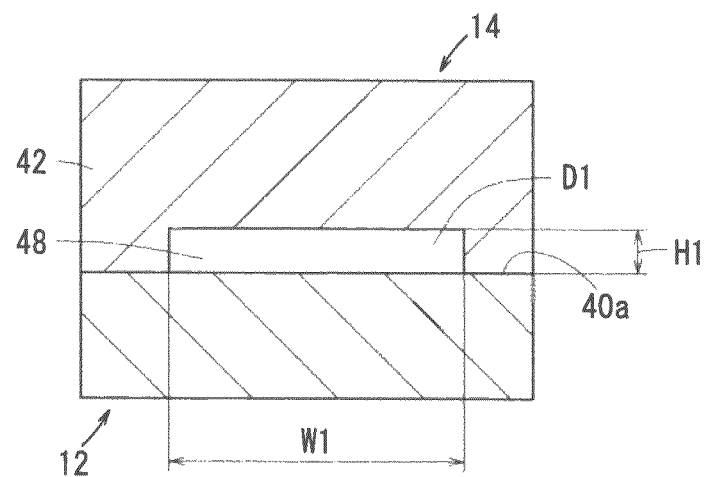
FIG. 7A is a cross sectional view taken along line VIIA-VIIA of FIG. 4.

The nozzles 46 include first nozzle grooves (first passages) 48, and second nozzle grooves (second passages) 50 positioned between the first nozzle grooves 48. As shown in FIG. 7A, each of the first nozzle grooves 48 is formed into a rectangular shape in cross section having a certain width W1 and a certain depth H1. The first nozzle groove 48 extends radially inwardly from the outer circumferential surface of the base 42 by a certain length, and an end of the first nozzle groove 48 is formed in a semi-circular shape. The end of the first nozzle groove 48 is separated away from the outer circumferential surface of the projection 44 of the plate 14 by a certain distance. Stated otherwise, each of the first nozzle grooves 48 extends radially from the outer circumferential surface of the base 42 to near the outer circumferential surface of the projection 44.

As shown in FIG. 5, the first nozzle grooves 48 are arranged at equal angular intervals of 90 degrees around the center of the plate 14.

As with the first nozzle grooves 48, each of the second nozzle grooves 50 is formed into a rectangular shape in cross section. The second nozzle groove 50 extends radially inwardly from the outer circumferential surface of the base 42 by a certain length, and an end of the second nozzle groove 50 is formed in a semi-circular shape. The end of the second nozzle groove 50 is separated away from the outer circumferential surface of the projection 44 of the plate 14 by a certain distance. The end of each first nozzle groove 48 and the end of each second nozzle groove 50 are separated away from the outer circumferential surface of the projection 44 by the same distance.

Each of the second nozzle grooves 50 is disposed between one of the first nozzle grooves 48 and another first nozzle groove 48 adjacent to the one first nozzle groove 48, and the second nozzle grooves 50 are arranged at equal angular intervals of 90 degrees around the center of the plate 14.

More specifically, the first and second nozzle grooves 48, 50 are alternately arranged at equal angular intervals of 45 degrees around the center of the plate 14, while the first nozzle grooves 48 are arranged at equal angular intervals of 90 degrees and the second nozzle grooves 50 are also arranged at equal angular intervals of 90 degrees.

When the plate 14 is fitted into the recess 34 of the housing 12, the first nozzle grooves 48 face the principal sides 18 substantially perpendicularly, while the second nozzle grooves 50 face the oblique sides 20 substantially perpendicularly.

Figure 7B:
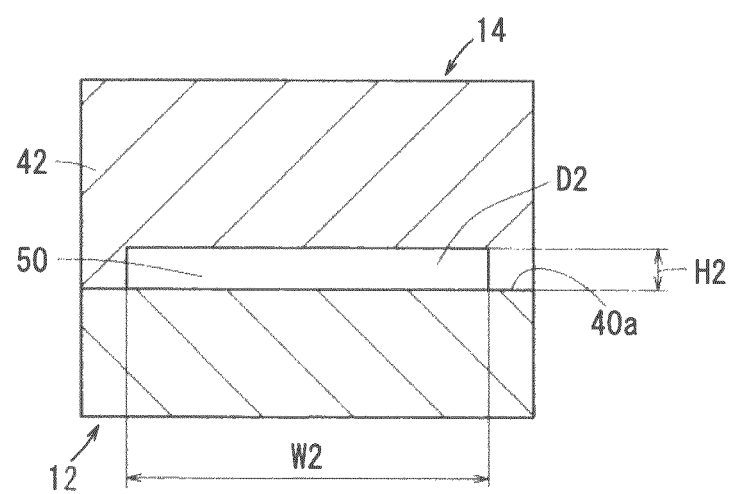
FIG. 7B is a cross sectional view taken along line VIIB-VIIB of FIG. 4.

As shown in FIG. 7B, the width W2 of each of the second nozzle grooves 50 is larger than the width W1 of each of the first nozzle grooves 48 (W1<W2). The depth (height) H2 of each of the second nozzle grooves 50 is equal to the depth (height) H1 of each of the first nozzle grooves 48 (H1=H2). Accordingly, since the second nozzle grooves 50 are wider than the first nozzle grooves 48, the cross sectional area D2 (W2×H2) of each of the second nozzle grooves 50 is larger than the cross sectional area D1 (W1×H1) of each of the first nozzle grooves 48 (D2>D1).

The cross sectional area D2 of the second nozzle groove 50 relative to the cross sectional area D1 of the first nozzle groove 48 is determined depending on a ratio (L2:L1) of a second distance L2 to a first distance L1 where the first distance L1 is a distance between the opening end of the first nozzle groove 48 and the principal side 18, and the second distance L2 is a distance between the opening end of the second nozzle groove 50 and the oblique side 20. For example, in a case where the ratio of the second distance L2 to the first distance L1 is 1.5, since the second distance L2 is 1.5 times the first distance L1, the cross sectional area D2 of the second nozzle groove 50 is set to be 1.5 times the cross sectional area D1 of the first nozzle groove 48.

More specifically, since the second distance L2 between the nozzle 46 and the oblique side 20 is longer than the first distance L1 between the nozzle 46 and the principal side 18 (L1<L2), if a pressure fluid is discharged through the opening ends of the nozzles 46 arranged on the same circle at the same flow rates, the flow rate of the pressure fluid near the principal sides 18 will be different from the flow rate thereof near the oblique sides 20. Stated otherwise, the flow rate thereof near the oblique sides 20 becomes lower than the flow rate thereof near the principal sides 18 depending on the first and second distances L1, L2.

In order to prevent such a difference, the cross sectional area D2 of the second nozzle groove 50 is set to be larger than the cross sectional area D1 of the first nozzle groove 48 depending on the ratio of the second distance L2 to the first distance L1, whereby the flow rate of the pressure fluid at the second nozzle groove 50 increases. As a result, the flow rate of the pressure fluid near the oblique sides 20 can be equalized to the flow rate thereof near the principal sides 18.

In contrast, in a case where the second distance L2 is smaller than the first distance L1 (L1>L2), the cross sectional area D2 of the second nozzle groove 50 is set to be smaller than the cross sectional area D1 of the first nozzle groove 48 (D1>D2).

On an end face of the projection 44, there is formed an annular groove at a position that is positioned radially inside of the outer circumferential surface of the projection 44. The sealing ring 16 is installed into the annular groove. The sealing ring 16 is made, for example, of an elastic material, and protrudes slightly from the end face of the projection 44.

Also, on the end face of the projection 44, there are formed a plurality of screw holes 52 on a circle and at positions that are positioned radially inside of the annular groove. The plate 14 is first fitted into the recess 34 of the housing 12. Thereafter, the fixation bolts 22 are inserted through the bolt holes 24, and the screws 22b of the fixation bolts 22 are then screw-engaged into the screw holes 52. Thus, the plate 14 is fixed with respect to the housing 12.

As shown in FIG. 4, the plate 14 is fitted into the recess 34 of the housing 12 such that the base 42 is positioned at the lower surface 12b side (the direction of arrow B) of the housing 12 while the projection 44 is positioned at the upper surface 12a side (the direction of arrow A) of the housing 12. The base 42 is inserted into the third hole 40, and the projection 44 is inserted into the first and second holes 36, 38 such that the sealing ring 16 abuts against the bottom wall surface 36a of the first hole 36. As a result, pressure fluid supplied from the supply port 32 to the second hole 38 is prevented from flowing to the central portion of the bottom wall surface 36a in the first hole 36.

Also, there is formed an annular space 54 having a certain clearance between the projection 44 and the inner circumferential surface 38b of the second hole 38. The space 54 communicates with the supply port 32 and the nozzles 46.

Further, the end face of the base 42 on the projection 44 side abuts against the bottom wall surface 40a of the third hole 40, and then passages for a pressure fluid are defined between the first and second nozzle grooves 48, 50 of the nozzles 46 and the bottom wall surface 40a, the passages communicating with the third hole 40 at the inner circumferential surface 40b side. The plate 14 is fitted into the recess 34 of the housing 12 such that the base 42 thereof does not protrude from the recess 34, and the end face of the plate 14 is substantially flush with the lower surface 12b of the housing 12 or slightly recedes from the lower surface 12b into the recess 34.

Since the base 42 and the housing 12 abut against each other at positions other than the nozzles 46, the pressure fluid does not flow around, but flows only through the nozzles 46. That is, the pressure fluid flows radially outwardly only through the nozzles 46, and further flows through the space 54 along the inner circumferential surface 40b of the third hole 40.

The non-contact transport apparatus 10 according to the first embodiment of the present invention is basically constructed as explained above. Next, operation and effects thereof will be described below. In the following description, explanation will be made concerning a case where an octagonal workpiece S (for example, a solar cell) obtained by cutting off the four corners of a square block at a certain angle is transported.

First, a pressure fluid is supplied to the supply port 32 through a pipe connected to an unillustrated pressure fluid supply source. The pressure fluid flows from the supply port 32 to the space 54 between the projection 44 of the plate 14 and the second hole 38 of the housing 12, and thereafter flows radially outwardly through the first and second nozzle grooves 48, 50 of the nozzles 46. More specifically, the pressure fluid flows from the annular space 54 through the eight first and second nozzle grooves 48, 50 and then is discharged radially in eight directions.

In this case, since the cross sectional area D1 of the first nozzle groove 48 is different from the cross sectional area D2 of the second nozzle groove 50, the flow rate of the pressure fluid through the second nozzle groove 50 having a larger cross sectional area is greater than the flow rate thereof through the first nozzle groove 48 having a smaller cross sectional area.

Next, the pressure fluid discharged from the nozzles 46 flows radially outwardly along the inner circumferential surface 40b of the third hole 40 and is guided toward the lower surface 12b of the housing 12. Thereafter, the pressure fluid flows to the lower surface 12b, and then flows along the lower surface 12b at a high speed. Thus, a negative pressure is generated on the lower surface 12b of the housing 12 due to the Bernoulli effect.

The non-contact transport apparatus 10 containing therein the housing 12 is moved, for example, by a robot arm, etc. At that time, the housing 12 is moved closer to the octagonal workpiece S in parallel to each other such that the principal sides 18 and the oblique sides 20 of the housing 12 correspond to the shape of the workpiece S. Then, the workpiece S is attracted toward the lower surface 12b under suction by the generated negative pressure. In this case, since an air layer is present between the workpiece S and the housing 12, in which the pressure fluid flows, the workpiece S does not contact with the housing 12. Thus, the workpiece S is retained in a non-contact state.

The pressure fluid is radially discharged through the first and second nozzle grooves 48, 50 having different cross sectional areas at different flow rates, and flows along the lower surface 12b of the housing 12. In this case, the flow rate of the pressure fluid flowing from the second nozzle grooves 50 to the four oblique sides 20 is set to be larger than the flow rate of the pressure fluid flowing from the first nozzle grooves 48 to the four principal sides 18. Thus, in the housing 12, even near the oblique sides 20 which are separated away from the nozzles 46 by a larger distance, the pressure fluid can flow at adequate flow rates as with near the principal sides 18. As a result, a negative pressure enough to retain the workpiece S can be generated both near the principal sides 18 and near the oblique sides 20, thereby retaining the workpiece S reliably and stably.

Stated otherwise, the entire workpiece S is retained stably in substantially parallel to the housing 12.

Figure 8A:
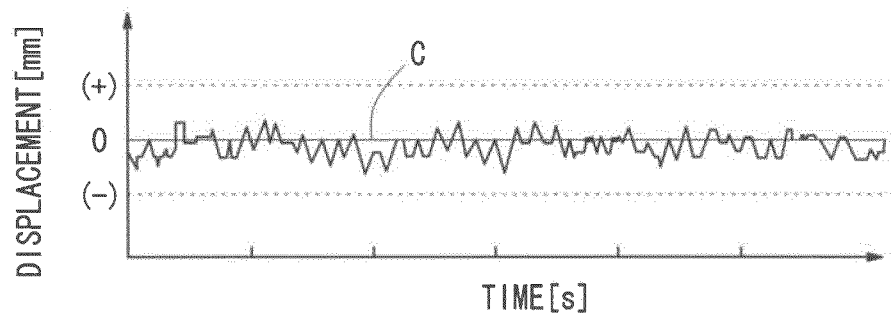
FIG. 8A is a graph of a characteristic curve showing change in vibration of a non-circular workpiece near the corner thereof when the workpiece is retained by use of the non-contact transport apparatus shown in FIG. 1.
Figure 8B:
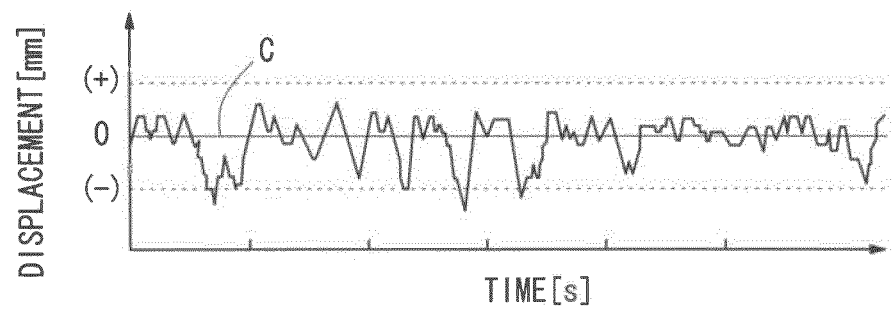
FIG. 8B is a graph of a characteristic curve showing change in vibration of the non-circular workpiece near a corner thereof when the workpiece is retained by use of a conventional non-contact transport apparatus.

Next, change in vibration of the workpiece S near the corners Sa will be explained with reference to FIGS. 8A and 8B. FIG. 8A is a characteristic curve showing a relationship between change in vibration and time in a case where an octagonal workpiece S is retained by use of the non-contact transport apparatus 10 according to the present invention. FIG. 8B is a characteristic curve showing a relationship between change in vibration and time in a case where the octagonal workpiece S is retained by use of a conventional non-contact transport apparatus.

As can be seen from FIG. 8A, in a state where the workpiece S is retained by the non-contact transport apparatus 10 according to the present invention, the workpiece S is displaced upward (+) and downward (−) with respect to a reference value C of displacement 0 indicating that the workpiece S is not displaced, and the displacement thereof vibrates upward and downward. However, the amplitudes of the vibration are smaller than those in the conventional non-contact transport apparatus shown in FIG. 8B.

Thus, as can be understood from FIGS. 8A and 8B, vibration of the workpiece S near the corners Sa, which would be most susceptible to such vibration, can be effectively prevented, compared to the case where a non-circular workpiece S is retained by the conventional non-contact transport apparatus. Accordingly, the non-contact transport apparatus 10 according to the present embodiment can retain the workpiece S reliably and stably, and damage or the like to the workpiece S due to the vibration can be avoided reliably.

As described above, when the non-contact transport apparatus 10 according to the first embodiment retains and transports a non-circular workpiece such as an octagonal workpiece S or the like, the housing 12 is formed into an octagonal shape in cross section such that the shape of the housing 12 corresponds to the shape of the workpiece S. Further, a plurality of nozzles 46 are provided to discharge a pressure fluid onto the lower surface 12b of the housing 12, and the nozzles 46 are arranged respectively so as to face and be perpendicular to the principal sides 18 and the oblique sides 20 which form the outer edge sections of the housing 12. Also, the cross sectional area D2 of the second nozzle groove 50 facing the oblique side 20 relative to the cross sectional area D1 of the first nozzle groove 48 facing the principal side 18 is determined depending on a ratio of the second distance L2 between the oblique side 20 and the opening end of the second nozzle groove 50 to the first distance L1 between the principal side 18 and the opening end of the first nozzle groove 48.

Accordingly, the cross sectional area D2 of the second nozzle groove 50 which is separated away from the oblique side 20 by a larger distance is set to be larger than the cross sectional area D1 of the first nozzle groove 48. Thus, the pressure fluid can flow at adequate flow rates even near the oblique sides 20 which are separated away from the nozzles 46 by a larger distance.

As a result, when pressure fluid is discharged from the nozzles 46 along the lower surface 12b of the housing 12, the flow rates thereof do not vary between near the principal sides 18 and near the oblique sides 20, and thus can be substantially equalized to each other. Therefore, the suction power produced on the lower surface 12b of the housing 12 can be substantially uniformized over the entire lower surface 12b.

Accordingly, the octagonal workpiece S can be attracted toward the housing 12 under suction and transported reliably and stably.

Also, the shape of the housing 12 is determined depending on the shape of a workpiece S, and is formed into an outer shape having a plurality of outer edge sections. The number of the first and second nozzle grooves 48, 50 is determined depending on the number of the outer edge sections. The cross sectional areas D1, D2 are determined depending on distances between the outer edge sections and the first nozzle grooves 48 and between the outer edge sections and the second nozzle grooves 50. Thus, workpieces S having various shapes can be transported reliably and stably.

In the above embodiment, the shape of the housing 12 includes two types of outer edge sections (principal side 18, oblique side 20) having different distances to the nozzles 46. However, the present invention is not limited in this respect. For example, the shape of the housing 12 may include three types of outer edge sections having different distances to the nozzles 46. In this case, the non-contact transport apparatus may include nozzle grooves having three types of cross sectional areas depending on the distance between the nozzles and the outer edge sections. As a result, a workpiece having an outer shape corresponding to the shape with the three types of outer edge sections can be transported stably.

Further, in the non-contact transport apparatus 10 according to the above embodiment, the housing 12 and the plate 14 are made of metal material. However, the present invention is not limited in this respect. For example, the housing 12 and the plate 14 may be made of resin material.

Still further, in the above non-contact transport apparatus 10, the nozzles 46 are provided on the base 42 of the plate 14. However, the nozzles 46 may be provided on the bottom wall surface 40a of the third hole 40 confronting the base 42, instead of on the plate 14 side.

Also, in the above embodiment, the first and second nozzle grooves 48, 50 have rectangular cross sections having widths W1, W2, and depths H1, H2 which are smaller in dimension than the widths W1, W2. However, the present invention is not limited in this respect. For example, unless the magnitude relationship between the cross sectional area D1 of the first nozzle groove 48 and the cross sectional area D2 of the second nozzle groove 50 changes, the depths H1, H2 may be set to be larger than the widths W1, W2, or alternatively the first and second nozzle groves 48, 50 may have circular cross sections.

Stated otherwise, as long as the cross sectional area D1 of the first nozzle groove 48 and the cross sectional area D2 of the second nozzle groove 50 are determined depending on the ratio between the first distance L1 and the second distance L2, the cross sectional shapes of the first and second nozzle grooves 48, 50 are not limited.

Next, a non-contact transport apparatus 100 according to a second embodiment will be described with reference to FIGS. 9 through 13. Constituent elements of the non-contact transport apparatus 100, which are the same as those of the non-contact transport apparatus 10 according to the first embodiment, are designated by the same reference characters, and descriptions of such elements have been omitted.

The non-contact transport apparatus 100 according to the second embodiment differs from the non-contact transport apparatus 10 according to the first embodiment in that a fluid discharge section 102 having a jagged shape, instead of the nozzles 46, is provided on the plate 104, in which protrusions and recesses are formed continuously along a circumferential direction thereof.

Figure 9:
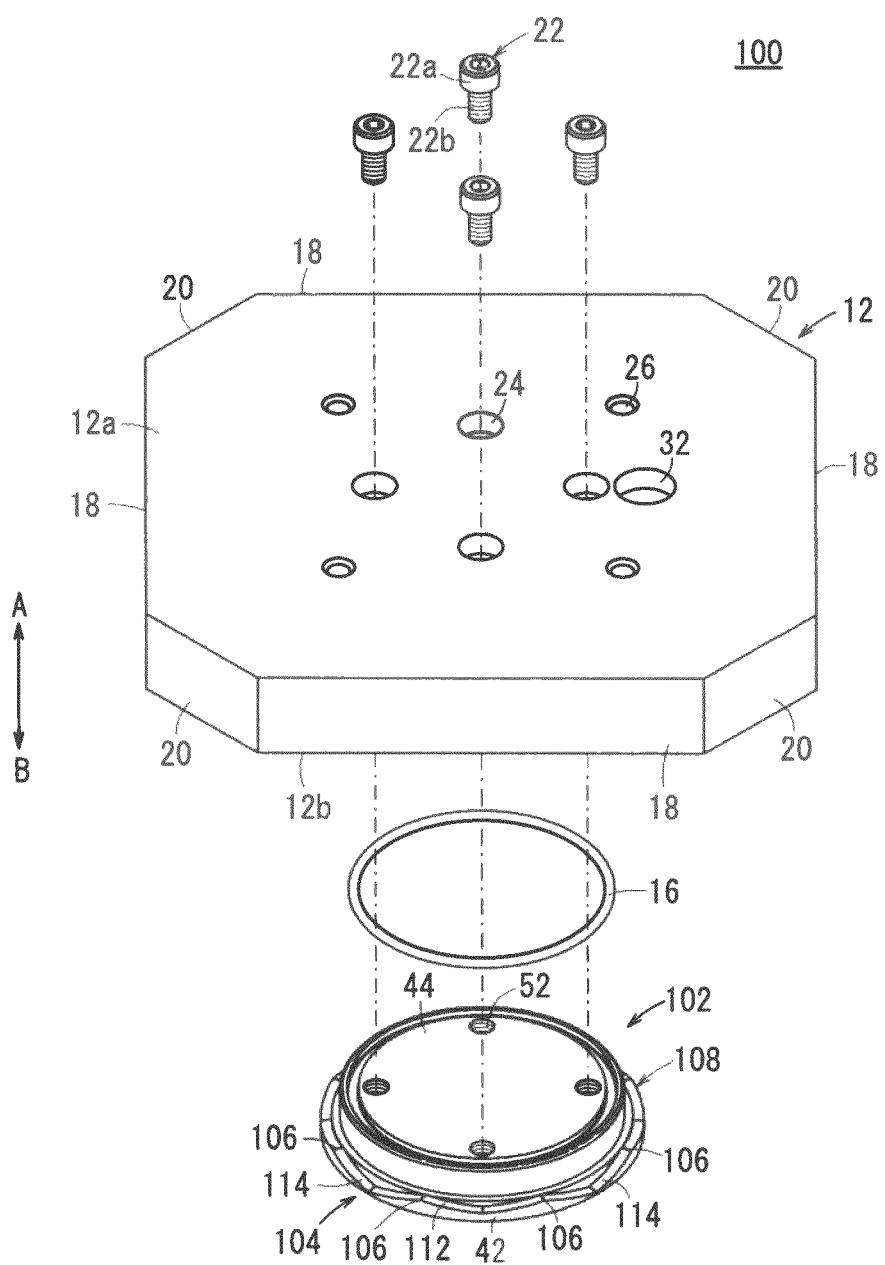
FIG. 9 is an exploded perspective view of a non-contact transport apparatus according to a second embodiment of the present invention.
Figure 10:
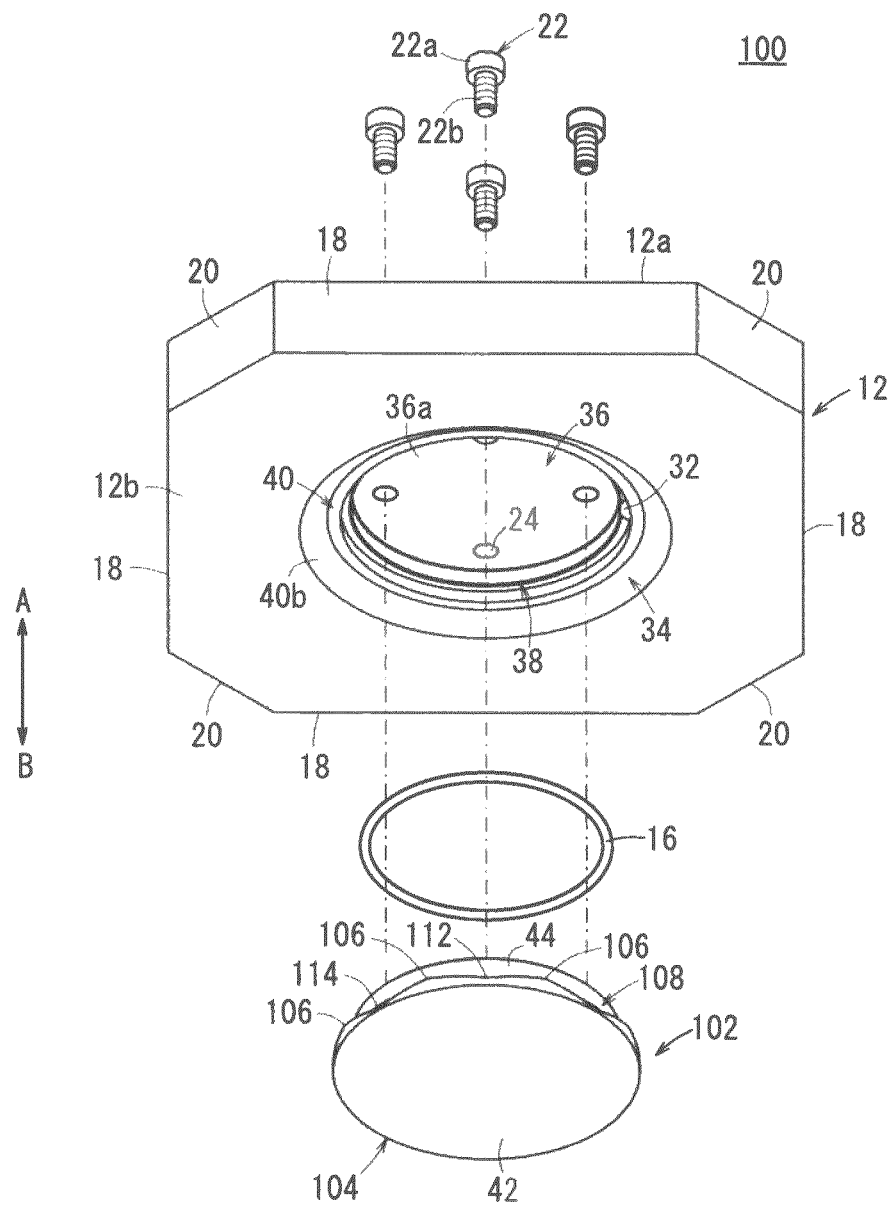
FIG. 10 is an exploded perspective view of the non-contact transport apparatus as viewed in a direction different from the direction in FIG. 9.

As shown in FIGS. 9 and 10, the fluid discharge section 102 is disposed on an end face of the base 42 of the plate 104 on the protrusion side (in the direction of arrow A). The fluid discharge section 102 is made up of a plurality of (for example, eight) top portions 106 and valley portions (discharge holes) 108. The top portions 106 protrude in a direction away from the end face. The valley portions 108 are formed between the top portions 106, and are recessed into the base 42.

Figure 11:
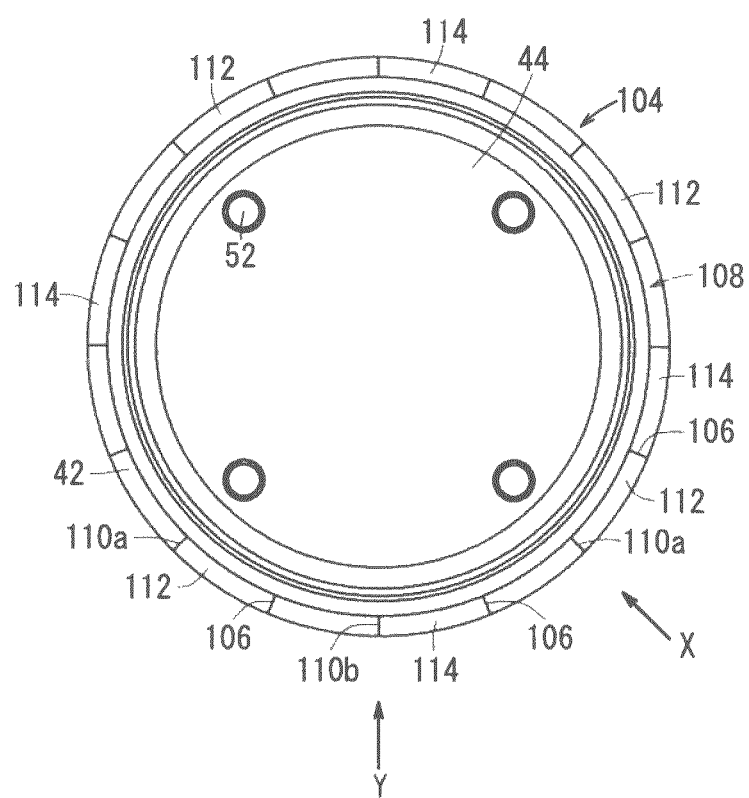
FIG. 11 is a plan view of a plate shown in FIG. 9.
Figure 12:
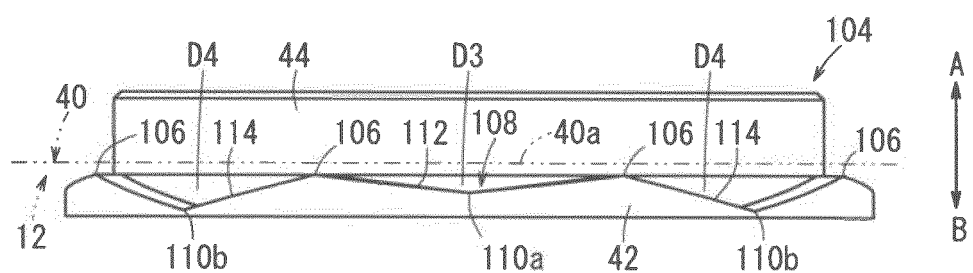
FIG. 12 is a side view of the plate as viewed in a direction indicated by arrow X in FIG. 11.
Figure 13:
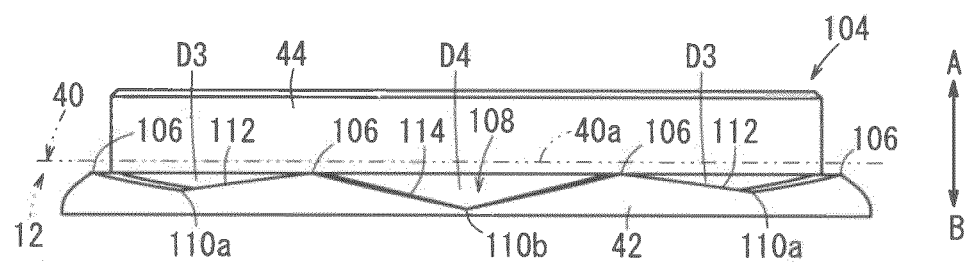
FIG. 13 is a side view of the plate as viewed in a direction indicated by arrow Y in FIG. 11.

As shown in FIGS. 11 through 13, the top portions 106 are arranged along the circumferential direction of the base 42 at equal angular intervals. Each of the top portions 106 is formed into a substantially triangular shape in cross section, which tapers in a direction away from the base 42 (in the direction of arrow A). When the plate 104 is fitted into the housing 12, the top portions 106 face the bottom wall surface 40a of the third hole 40 and are separated away from the bottom wall surface 40a by a certain distance. That is, a certain clearance is present between the top portions 106 of the fluid discharge section 102 and the bottom wall surface 40a of the third hole 40 (see FIGS. 12 and 13).

Each of the valley portions 108 has a triangular shape in cross section defined by two inclined surfaces. The two inclined surfaces extend respectively from the adjacent top portions 106 in a direction in which the two inclined surfaces approach toward each other, and are inclined in a direction approaching the base 42 (in the direction of arrow B) at a certain angle. The number of the valley portions 108 is equal to the number of the top portions 106 (for example, eight). Each of the valley portions 108 is the deepest at the intersection of the two inclined surfaces.

There are two types of the valley portions 108, i.e., first recesses 112 and second recesses 114, in which the depths from the top portions 106 at their respective deepest points are different from each other. More specifically, each of the first recesses 112 has a deepest point 110a, while each of the second recesses 114 has a deepest point 110b. The depth from the top portion 106 at the deepest point 110b is larger than the depth therefrom at the deepest point 110a. Stated otherwise, in the valley portions 108, the deepest points 110b of the second recesses 114 are closer to the base 42 end (in the direction of arrow B) than the deepest points 110a of the first recesses 112.

The opening cross sectional area D4 of the second recess 114 relative to the opening cross sectional area D3 of the first recess 112 is determined depending on a ratio of a distance between the opening end of the second recess 114 and the oblique side 20 to a distance between the opening end of the first recess 112 and the principal side 18.

When the plate 104 is fitted into the recess 34 of the housing 12, the first recesses 112 face the principal sides 18 substantially perpendicularly, while the second recesses 114 face the oblique sides 20 substantially perpendicularly.

In the above explanation, the top portions 106 of the plate 104 are separated away from the bottom wall surface 40a of the third hole 40 of the housing 12. However, the present invention is not limited in this respect. For example, the top portions 106 may abut against the bottom wall surface 40a.

According to the non-contact transport apparatus 100 as constructed above, a pressure fluid is supplied from the supply port 32 into the housing 12, and then the pressure fluid is discharged radially outwardly through the first and second recesses 112, 114 of the fluid discharge section 102. In this case, since the opening cross sectional areas D3, D4 of the first and second recesses 112, 114 are different from each other, the flow rate of the pressure fluid discharged through the second recesses 114 having a larger opening cross sectional area is greater than the flow rate of the pressure fluid discharged through the first recesses 112 having a smaller opening cross sectional area.

Then, the pressure fluid discharged through the first and second recesses 112, 114 is guided to the lower surface 12b of the housing 12, and flows along the lower surface 12b at a high speed. Accordingly, a negative pressure is generated on the lower surface 12b of the housing 12 due to the Bernoulli effect, and then the workpiece S is attracted toward the lower surface 12b under suction. As a result, the workpiece S is retained in a non-contact state with respect to the housing 12.

The non-contact transport apparatus according to the present invention is not limited to the embodiments described above, but various alternative or additional features and structures may be adopted without deviating from the essence and scope of the invention as set forth in the appended claims.

What is claimed is:

1. A non-contact transport apparatus for attracting a workpiece under suction by supply of a pressure fluid, and retaining and transporting the workpiece in a non-contact state, the non-contact transport apparatus comprising:
    a body which is formed into an outer shape corresponding to a shape of the workpiece; and
    a fluid discharge section provided on an end face of the body facing the workpiece, the fluid discharge section including a plurality of discharge holes for discharging the pressure fluid along the end face,
    wherein the body includes a plurality of outer edge sections, distances between the discharge holes and the outer edge sections being different; and
    wherein the discharge holes face the outer edge sections, and have cross sectional areas which are formed in proportion to the distances between the discharge holes and the outer edge sections.

2. The non-contact transport apparatus according to claim 1, wherein the number of the discharge holes is equal to the number of the outer edge sections, and the discharge holes are perpendicular to side walls of the outer edge sections.

3. The non-contact transport apparatus according to claim 1, wherein each of the discharge holes is formed into a flattened shape which is larger in a width direction parallel to the end face of the body and is smaller in a thickness direction of the body perpendicular to the width direction.

4. The non-contact transport apparatus according to claim 1,
    wherein the outer edge sections of the body comprise four first sides, and four second sides each placed between the first sides and which are inclined relative to the first sides at a certain angle, and the body is formed into an octagonal shape defined by the first sides and the second sides; and
    wherein the discharge holes comprise four first passages facing the first sides, and four second passages each provided between the first passages and which face the second sides.

5. The non-contact transport apparatus according to claim 1, wherein each of the discharge holes comprises a groove formed in the fluid discharge section.

6. The non-contact transport apparatus according to claim 1, wherein the discharge holes comprise:
    a first nozzle groove having a smaller cross sectional area; and
    a second nozzle groove having a cross sectional area which is larger than the cross sectional area of the first nozzle groove; and
    wherein the first nozzle groove faces one of the outer edge sections, the distance between the first nozzle groove and the one of the outer edge sections being smaller, while the second nozzle groove faces another of the outer edge sections, the distance between the second nozzle groove and the other of the outer edge sections being larger.

* * * * *